United States Patent
Shoji et al.

[11] Patent Number: 6,118,166
[45] Date of Patent: Sep. 12, 2000

[54] THIN-FILM MICROSTRUCTURE SENSOR HAVING A TEMPERATURE-SENSITIVE RESISTOR TO PROVIDE A LARGE TCR WITH LITTLE VARIATION

[75] Inventors: Hiroyoshi Shoji; Takayuki Yamaguchi; Junichi Azumi; Yukito Sato; Morimasa Kaminishi, all of Miyagi, Japan

[73] Assignees: Ricoh Company, Ltd., Tokyo; Ricoh Elemex Corporation, Nagoya, both of Japan

[21] Appl. No.: 09/013,900

[22] Filed: Jan. 27, 1998

[30] Foreign Application Priority Data

Jan. 31, 1997 [JP] Japan .................................. 9-018243

[51] Int. Cl.[7] .......................... H01L 27/14; H01L 29/82; H01L 23/48; H01L 23/52; H01L 29/40

[52] U.S. Cl. .......................... 257/467; 257/414; 257/415; 257/768; 257/769

[58] Field of Search ..................... 257/414, 415, 257/419, 420, 467, 768, 769

[56] References Cited

U.S. PATENT DOCUMENTS 4,472,239  9/1984  Johnson et al. ..................... 257/467
4,650,561  3/1987  Robins et al. ..................... 204/416
4,931,851  6/1990  Sibbald et al. ..................... 357/25
4,952,904  8/1990  Johnson et al. ..................... 257/757
5,780,173  7/1998  Harrington et al. ..................... 257/769

FOREIGN PATENT DOCUMENTS

61-235726  10/1986  Japan .

*Primary Examiner*—Mahshid Saadat
*Assistant Examiner*—Jesse A. Fenty
*Attorney, Agent, or Firm*—Oblon, Spivak, McClelland, Maier & Neustadt, P.C.

[57] ABSTRACT

A thin-film microstructure sensor includes a substrate having an insulation layer. A thin-film platinum temperature-sensitive resistor is provided on the insulation layer of the substrate, the thin-film platinum temperature-sensitive resistor comprising a platinum layer, the platinum layer having a maximum crystal grain size above a reference grain size of 800 Å. The thin-film platinum temperature-sensitive resistor is formed by a sputtering process to provide a temperature coefficient of resistance TCR above a reference TCR level of 3200 ppm.

6 Claims, 7 Drawing Sheets

FIG.11

THIN-FILM MICROSTRUCTURE SENSOR HAVING A TEMPERATURE-SENSITIVE RESISTOR TO PROVIDE A LARGE TCR WITH LITTLE VARIATION

BACKGROUND OF THE INVENTION (1) Field of the Invention

The present invention relates to a thin-film microstructure sensor in which a thin-film platinum temperature-sensitive resistor is formed on an insulation layer of a substrate. The thin-film microstructure sensor is suitably applied to a flow sensor, a humidity sensor, a gas sensor or a temperature sensor. The present invention further relates to a method of producing a thin-film platinum temperature-sensitive resistor on an insulation layer of a substrate through a sputtering process.

(2) Description of the Related Art

A thin-film microstructure sensor in which a thin-film platinum layer is provided on an isolated substrate for the purpose of measurement is known. The thin-film microstructure sensor of this type utilizes temperature-resistance characteristics of the thin-film platinum layer for measuring a flow rate of fluid, for measuring a humidity of an ambient atmosphere, for detecting presence of a gas in an ambient atmosphere, or for measuring a temperature of an ambient atmosphere. The thin-film microstructure sensor is capable of converting a change in resistance of the platinum layer into a change in temperature of the fluid or the ambient atmosphere. In the thin-film microstructure sensor, the measurement or the detection is performed based on the resistance-to-temperature conversion. The thin-film microstructure sensor is suitably applied to a flow sensor, a humidity sensor, a gas sensor or a temperature sensor.

For example, a conventional thin-film microstructure sensor uses a silicon substrate having an insulation layer, and a size of the substrate is on the order of a millimeter square. In the conventional thin-film microstructure sensor, a recessed portion is provided in the silicon substrate, and a bridge portion, including a heating element of platinum and two temperature-sensing elements of platinum, is provided over the recessed portion of the substrate. Some proposals for the arrangement of the bridge portion in the conventional thin-film microstructure sensor have been made in order for the heating element to efficiently generate heat and reduce heat loss to the substrate or to a supporting base which supports the substrate thereon.

A method of measuring a flow rate of a fluid used by the thin-film microstructure flow sensor will now be explained. That is, the thin-film microstructure flow sensor is placed into a flow of a fluid such that the temperature-sensing elements of the bridge portion extend in a direction perpendicular to the direction of the fluid flow. The temperature-sensing elements of the flow sensor are an upstream temperature-sensing element and a downstream temperature-sensing element with respect to the fluid flow. A control circuit of the flow sensor supplies voltage to the heating element and the upstream and downstream temperature-sensing elements of the bridge portion such that electric current flows through the bridge portion to increase a temperature of the bridge portion. The voltage supplied to the bridge portion is controlled by the control circuit such that both the bridge portion and the fluid are held at a constant temperature. The flow sensor under this condition measures a flow rate of the fluid based on a change in the voltage supplied to the bridge portion.

Japanese Laid-Open Patent Application No. 61-235726 discloses a flow measuring apparatus including a conventional thin-film microstructure flow sensor of the above-mentioned type. The flow measuring apparatus measures a flow rate of a specific gas used in a fabrication process of a semiconductor device. The flow measuring apparatus of the above-mentioned publication includes several thin-film microstructure sensors, such as a thin-film microstructure flow sensor provided in an internal passage of the semiconductor device, a stagnant gas flow sensor provided in a stagnant gas passage of the semiconductor device, and a temperature sensor provided at an inlet of the internal passage directed to the thin-film microstructure flow sensor. The temperature sensor is used to retain a temperature of the gas at the inlet of the internal passage.

Generally, accuracy of measurement of the thin-film microstructure sensors greatly depends on a temperature coefficient of resistance (TCR) of the platinum layer on the substrate. However, there is a problem in that the TCR of the platinum layer of the thin-film micro-structure sensors which are produced by manufacturing processes may vary greatly. The resistance-temperature characteristics of the sensor in operation are very sensitive to variations of the TCR of the platinum layer. The yield of the thin-film microstructure sensors providing a desired level of accuracy of measurement will be lowered due to the variations of the TCR, which will increase the cost of manufacture.

In addition, in the conventional thin-film microstructure sensors, such as flow sensors, humidity sensors and gas sensors, the heating element of the platinum layer is heated to an increased temperature above a room temperature. Repeated use of the conventional thin-film microstructure sensors over a prolonged time may cause migration in the platinum layer, and a value of resistance of the platinum layer tends to vary significantly. Therefore, there is a problem in that the accuracy of measurement of the conventional thin-film microstructure sensors is not reliable if the variations of the resistance value of the platinum layer exceed the order of several percents.

SUMMARY OF THE INVENTION

An object of the present invention is to provide an improved thin-film microstructure sensor in which the above-described problems are eliminated.

Another object of the present invention is to provide a thin-film microstructure sensor having a thin-film platinum temperature-sensitive resistor which provides a large TCR with little variation for measurement of a fluid flow rate or another quantity while providing a stability of resistance for repeated use over a prolonged time.

Still another object of the present invention is to provide a method of producing a thin-film platinum temperature-sensitive resistor through a sputtering process wherein the resistor provides a large TCR with little variation for measurement of a fluid flow rate or another quantity while providing a stability of resistance for repeated use over a prolonged time.

The above-mentioned objects of the present invention are achieved by a thin-film microstructure sensor comprising: a substrate which has an insulation layer; and a thin-film platinum temperature-sensitive resistor which is provided on the insulation layer of the substrate, the thin-film platinum temperature-sensitive resistor comprising at least one platinum layer which has a maximum crystal grain size above a reference grain size.

The above-mentioned objects of the present invention are achieved by a method of producing a thin-film platinum temperature-sensitive resistor, the method comprising the steps of: forming a first insulation layer on a substrate; forming a platinum layer on the first insulation layer of the substrate by performing a sputtering process; forming a second insulation layer on the platinum layer; and performing a patterning of the platinum layer through etching by using the second insulation layer as a mask, so that a thin-film platinum temperature-sensitive resistor is produced on the first insulation layer of the substrate, wherein the sputtering process is performed under sputtering conditions in which a radio-frequency power is set in a range of 0.54 W/cm$^2$ to 2.74 W/cm$^2$ and a temperature of the substrate is set in a range of 100° C. to 500° C. in such a manner that a maximum crystal grain size of the platinum layer is above a reference grain size.

The above-mentioned objects of the present invention are achieved by a method of producing a thin-film platinum temperature-sensitive resistor, the method comprising the steps of: forming a first insulation layer on a substrate; forming a platinum layer on the first insulation layer of the substrate by performing a sputtering process; forming a second insulation layer on the platinum layer; and performing a patterning of the platinum layer through etching by using the second insulation layer as a mask, so that a thin-film platinum temperature-sensitive resistor is produced on the first insulation layer of the substrate, wherein the sputtering process is performed under sputtering conditions in which a radio-frequency power is set in a range of 0.54 W/cm$^2$ to 2.74 W/cm$^2$ and a temperature of the substrate is set in a range of 100° C. to 500° C. in such a manner that the thin-film platinum temperature-sensitive resistor provides a temperature coefficient of resistance (TCR) above a reference TCR level.

In the thin-film microstructure sensor of the present invention, the thin-film platinum temperature-sensitive resistor includes a platinum layer having a maximum crystal grain size above the reference grain size. Since a temperature coefficient of resistance TCR of the thin-film platinum temperature-sensitive resistor is closely related to the maximum crystal grain size of the platinum layer, the thin-film platinum temperature-sensitive resistor of the present invention provides a large TCR above the reference TCR level. Since a resistance change ratio of the thin-film platinum temperature-sensitive resistor is closely related to the maximum crystal grain size of the platinum layer, the thin-film platinum temperature-sensitive resistor of the present invention provides a very small resistance change ratio. Therefore, the thin-film microstructure sensor of the present invention provides a large TCR with little variation for measurement of a fluid flow rate or the like. The thin-film platinum temperature-sensitive resistor of the present invention is effective in providing a stability of resistance for repeated use over a prolonged time.

Further, in the method of production of a thin-film platinum temperature-sensitive resistor according to the present invention, the sputtering conditions are suitably set in such a manner that the maximum crystal grain size of the platinum layer is above a reference grain size, or in such a manner that the thin-film platinum temperature-sensitive resistor provides a temperature coefficient of resistance TCR above a reference TCR level. Therefore, the thin-film microstructure sensor having the thin-film platinum temperature-sensitive resistor produced by the method of the present invention provides a large TCR with little variation for measurement of a fluid flow rate or the like. The thin-film platinum temperature-sensitive resistor of the present invention is effective in providing a stability of resistance for repeated use over a prolonged time.

BRIEF DESCRIPTION OF THE DRAWINGS

Other objects, features and advantages of the present invention will become more apparent from the following detailed description when read in conjunction with the accompanying drawings in which.

DETAILED DESCRIPTION OF THE PREFERRED EMBODIMENTS

A description will now be given of the preferred embodiments of the present invention with reference to the accompanying drawings.

FIG. 1A through FIG. 1E show a method of producing a thin-film platinum temperature-sensitive resistor for a thin-film microstructure sensor of the present invention. FIG. 2 shows a first embodiment of the thin-film microstructure sensor of the present invention. The thin-film microstructure sensor of the present embodiment is a flow sensor S1 which outputs a signal indicating a measured fluid flow rate.

Figure 1A:
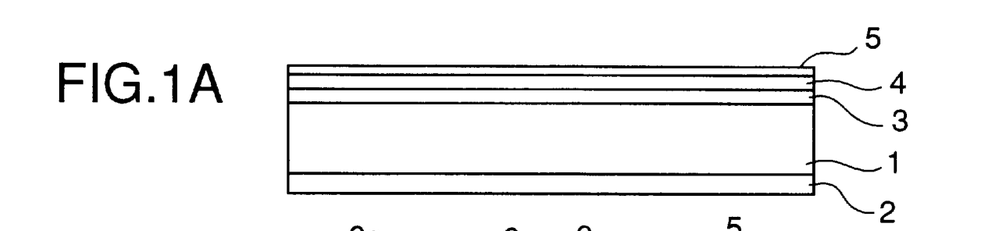
FIG. 1A through FIG. 1E are diagrams for explaining a method of producing a thin-film platinum temperature-sensitive resistor for a thin-film microstructure sensor of the present invention.
Figure 2:
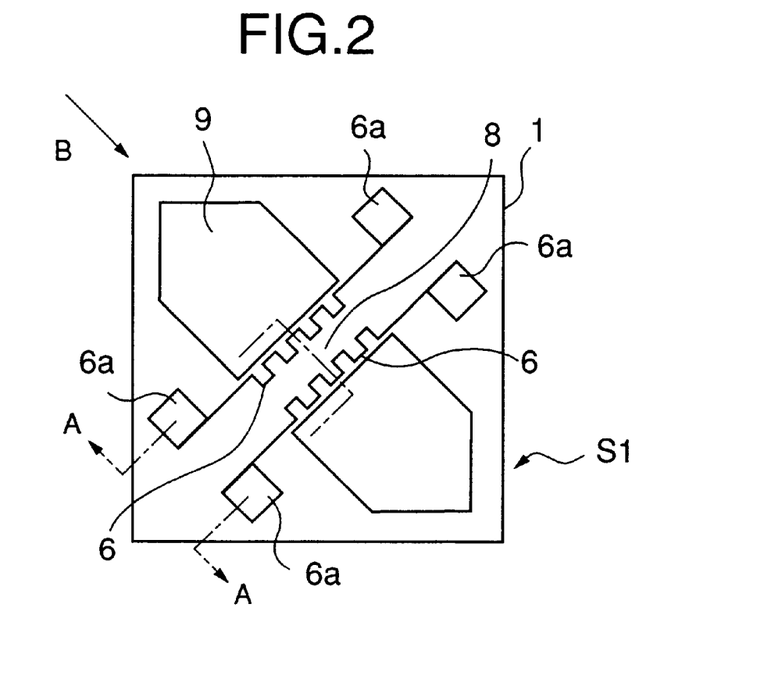
FIG. 2 is a top view of a first embodiment of the thin-film microstructure sensor of the present invention.

As shown in FIG. 1A, a silicon substrate 1 is provided as a substrate in the present embodiment. First, a silicon dioxide layer 2 is formed on a bottom surface of the silicon substrate 1 in order to avoid etching of the bottom surface of the silicon substrate 1 during an anisotropic etching step which is subsequently performed. On a top surface of the silicon substrate 1, an insulation layer 3, a platinum layer 4 and an insulation layer 5 are formed in this order. The insulation layer 5 is used as a mask in a patterning of the platinum layer 4. These layers 2–5 are provided on the silicon substrate 1 as shown in FIG. 1A.

Specifically, the insulation layer 3 in this embodiment is made of $Ta_2O_5$, and a thickness of the insulation layer 3 is about 1.5 μm.

The platinum layer 4 in the present embodiment is formed at a thickness of 1200 Å by performing a radio-frequency a.c. sputtering process. Sputtering conditions in this embodiment are: a radio-frequency (RF) power is set at 1.2 W/cm$^2$; and a temperature of the silicon substrate 1 is set at 400° C. The above-mentioned sputtering conditions yield the platinum layer 4 (or platinum layers 6) of a maximum crystal grain size of about 1500 Å. This maximum crystal grain size is above a reference grain size (or 800 Å) according to the present invention.

Hereinafter, the maximum crystal grain size of the platinum layer is indicated by a microscopically measured size or diameter of the largest one of crystal grains in the platinum layer 4 (or the platinum layers 6) of the thin-film microstructure sensor. The measurement of the maximum crystal grain size is performed by using a scanning electron microscope.

The reason why the crystal grains in the thin-film platinum layer developed by the sputtering process according to the present invention have a relatively large size will now be described. During the sputtering process, atoms of platinum are discharged from the cathode surface to the insulation layer 3 of the silicon substrate 1, and the atoms agglomerate into a number of nucleuses on the insulation layer 3 of the silicon substrate 1. Clusters increasingly grow from the nucleuses. Since the sputtering process according to the present invention is performed under the sputtering conditions as mentioned above, some clusters can quickly grow in the lateral directions on the insulation layer 3 of the silicon substrate 1 while the adjacent clusters slowly grow. In order to obtain a thin-film platinum layer having large crystal grains, it is important to suitably set the sputtering conditions. Accordingly, the above-mentioned sputtering conditions yield the platinum layer 4 with a maximum crystal grain size above the reference grain size.

The insulation layer 5 in this embodiment is made of Ta$_2$O$_5$, and a thickness of the insulation layer 5 is about 2000 Å. These layers 3, 4 and 5 may be continuously formed on the substrate 1.

Hereinafter, the radio-frequency (RF) power is indicated by a value of a.c. power per unit area of the target (or the cathode), the a.c. power being supplied to the target so as to generate plasma during the radio-frequency sputtering process.

Figure 1B:
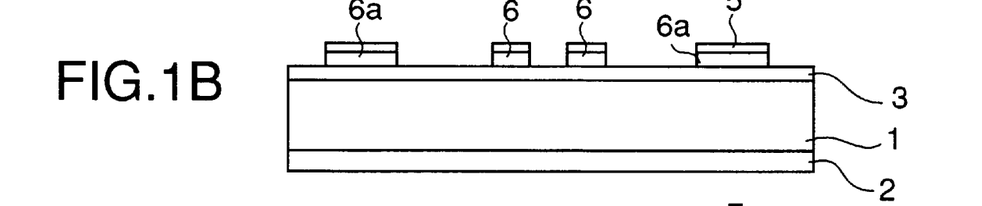

Next, as shown in FIG. 1B, a patterning of the platinum layer 4 is performed through etching by using the insulation layer 5 as the mask in order to create a pattern of two platinum layers 6 and pads 6a at ends of each platinum layer 6 from the platinum layer 4. Specifically, photolithography and etching steps for the insulation layer 5 are performed, and, by using the resulting insulation layer 5 as the mask, an etching step for the platinum layer 4 is performed. In the present embodiment, the resulting pattern of the platinum layer 4 includes the two platinum layers 6 and the pads 6a at the ends of each platinum layer 6, as shown in FIG. 2.

Figure 1C:
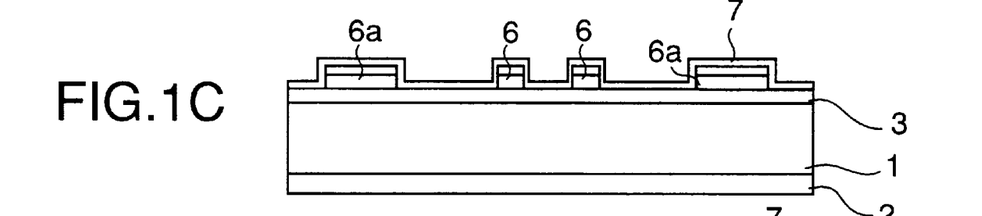

Next, as shown in FIG. 1C, a passivation layer 7 is formed on the external surface of the silicon substrate 1 so as to cover the platinum layers 6 and the pads 6a. The passivation layer 7 in the present embodiment is made of Ta$_2$O$_5$, and a thickness of the passivation layer 7 is about 3000 Å.

Figure 1D:
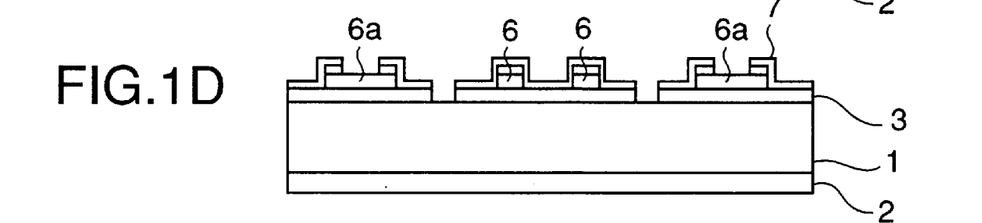

Next, as shown in FIG. 1D, a patterning of the passivation layer 7 is performed. Specifically, a photomask (not shown) is placed on the external surface of the silicon substrate 1, and an etching step for predetermined portions of the passivation layer 7 and the insulation layer 3 is performed, so that a middle portion of each of the pads 6a and a portion of the top surface of the silicon substrate 1 are exposed by removing the passivation layer 7 and the insulation layer 3.

Figure 1E:
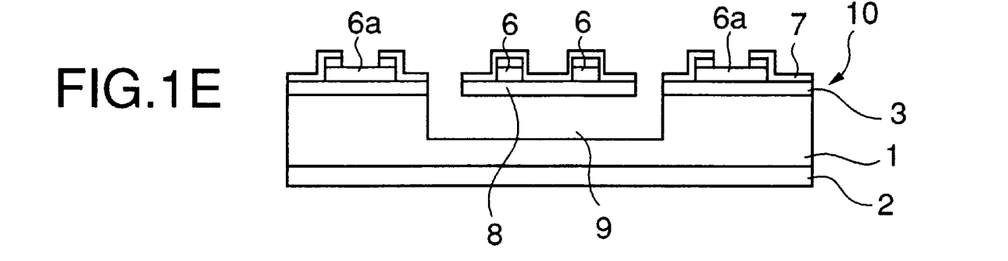

Finally, as shown in FIG. 1E, a bridge portion 8 and a recessed portion 9 are provided in the middle of the silicon substrate 1. Specifically, an anisotropic etching step for the above-mentioned portion of the top surface of the silicon substrate 1, from which the insulation layer 3 has been removed, is performed to form the recessed portion 9 in the silicon substrate 1. A resulting pattern of the recessed portion 9 is as shown in FIG. 2. The remaining portion of the insulation layer 3 after the recessed portion 9 is formed becomes the bridge portion 8. Thus, the bridge portion 8 is provided over the recessed portion 9, and the bridge portion 8 includes the platinum layers 6 and the insulation layer 3. The anisotropic etching is performed by using a water solution of potassium hydroxide (KOH).

By performing the above-described steps of the production method, a thin-film platinum temperature-sensitive resistor 10 shown in FIG. 1E is produced. The thin-film platinum temperature-sensitive resistor 10 comprises the platinum layers 6 and the pads 6a.

Further, a wire bonding step for the thin-film platinum temperature-sensitive resistor 10 is performed to electrically connect the pads 6a with a control circuit (not shown) by wires, so that a flow sensor S1, including the thin-film platinum temperature-sensitive resistor 10 and the control circuit, is produced. FIG. 1E is a cross-sectional view of the thin-film platinum temperature-sensitive resistor 10 taken along a one-dot chain line A—A indicated in FIG. 2.

As shown in FIG. 2, the flow sensor S1 is placed into a flow of a fluid for measurement of a fluid flow rate. The arrow "B" indicated in FIG. 2 denotes a direction of the fluid flow. As shown, the two platinum layers 6 on the bridge portion 8 of the flow sensor S1 are arranged in a horizontal condition such that the platinum layers 6 extend in a direction perpendicular to the direction "B" of the fluid flow. The two platinum layers 6 are an upstream platinum layer 6 and a downstream platinum layer 6 with respect to the fluid flow.

The control circuit (not shown) of the flow sensor S1 supplies voltage to the platinum layers 6 via the pads 6a so as to increase the temperature of the platinum layers 6. Since electric current flows through the platinum layers 6, both the platinum layers 6 are heated. The platinum layers 6 serve as temperature-sensitive heating elements. The heat of the upstream platinum layer 6 is taken in the fluid, and the temperature of the upstream platinum layer 6 is lowered. The heat from the fluid is transferred to the downstream platinum layer 6, and the temperature of the downstream platinum layer 6 is raised by the heat transfer.

The voltage supplied to the platinum layers 6 is controlled by the control circuit such that both the platinum layers 6 and the fluid are held at a constant temperature. In the flow sensor S1 under this condition, a flow rate of the fluid is measured based on a difference between the voltage supplied to the upstream platinum layer 6 and the voltage supplied to the downstream platinum layer 6. The flow sensor S1 outputs a signal indicating the measured flow rate of the fluid.

Figure 3:
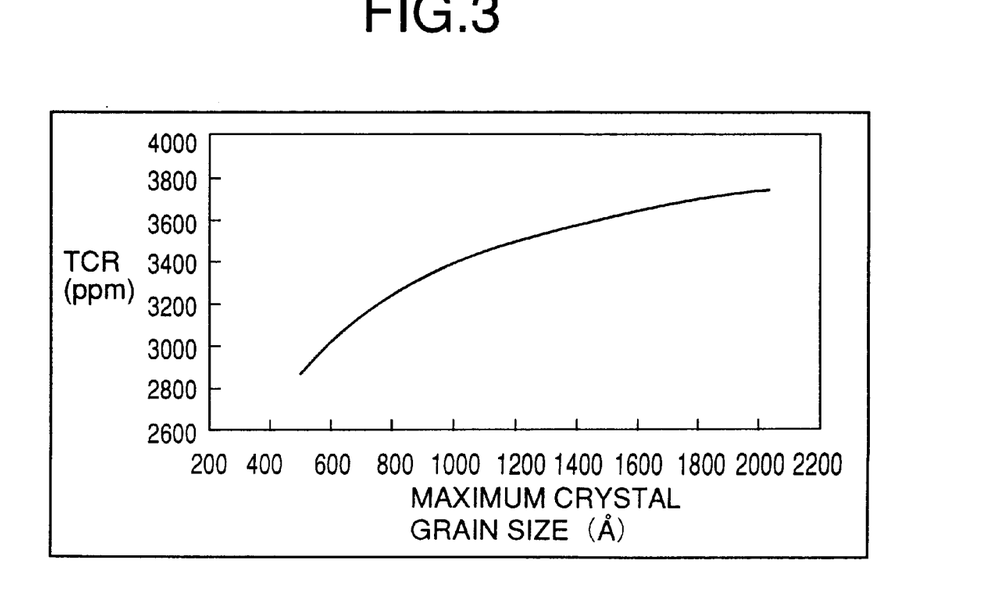
FIG. 3 is a chart for explaining a relationship between maximum crystal grain size and temperature coefficient of resistance (TCR) for the thin-film platinum temperature-sensitive resistor.
Figure 4:
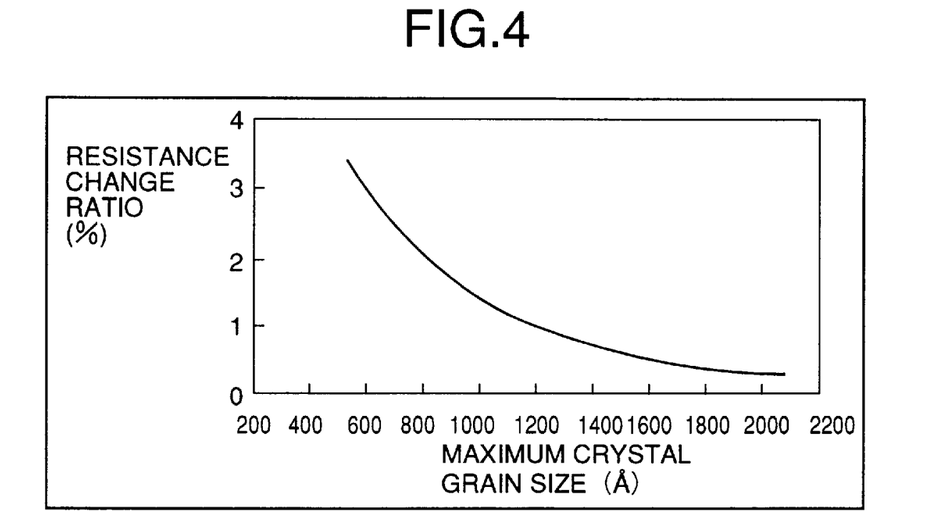
FIG. 4 is a chart for explaining a relationship between maximum crystal grain size and resistance change ratio for the thin-film platinum temperature-sensitive resistor.

FIG. 3 shows a relationship between maximum crystal grain size and temperature coefficient of resistance (TCR) for the thin-film platinum temperature-sensitive resistor 10. FIG. 4 shows a relationship between maximum crystal grain size and resistance change ratio for the thin-film platinum temperature-sensitive resistor 10. The charts of FIG. 3 and FIG. 4 are obtained from experimental results.

As in the chart of FIG. 3, the temperature coefficient of resistance (TCR) of the thin-film platinum temperature-sensitive resistor 10 is closely related to the maximum crystal grain size of the platinum layers 6. It is found that the thin-film platinum temperature-sensitive resistor 10 can provide a TCR above 3200 ppm (or above a reference TCR level) if the sputtering conditions yield a maximum crystal grain size above 800 Å (or above the reference grain size).

As in the chart of FIG. 4, the resistance change ratio of the thin-film platinum temperature-sensitive resistor 10 is closely related to the maximum crystal grain size 10 of the platinum layers 6. It is found that the thin-film platinum temperature-sensitive resistor 10 can provide a resistance change ratio below 2% if the sputtering conditions yield a maximum crystal grain size above 800 Å (or above the reference grain size). Accordingly, if the sputtering conditions yield a maximum crystal grain size above 800 Å (or above the reference grain size), the thin-film platinum temperature-sensitive resistor 10 of the thin-film microstructure sensor of the present invention can provide a large TCR with little variation for measurement of a fluid flow rate or the like.

Figure 5:
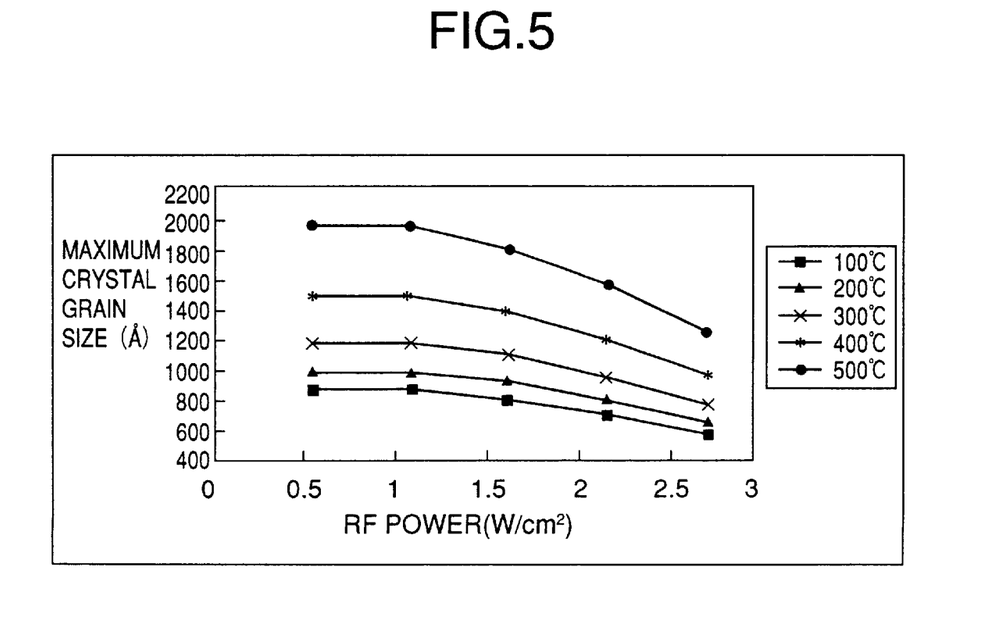
FIG. 5 is a chart for explaining a relationship between radio-frequency (RF) power and maximum crystal grain size for the thin-film platinum temperature-sensitive resistor.
Figure 6:
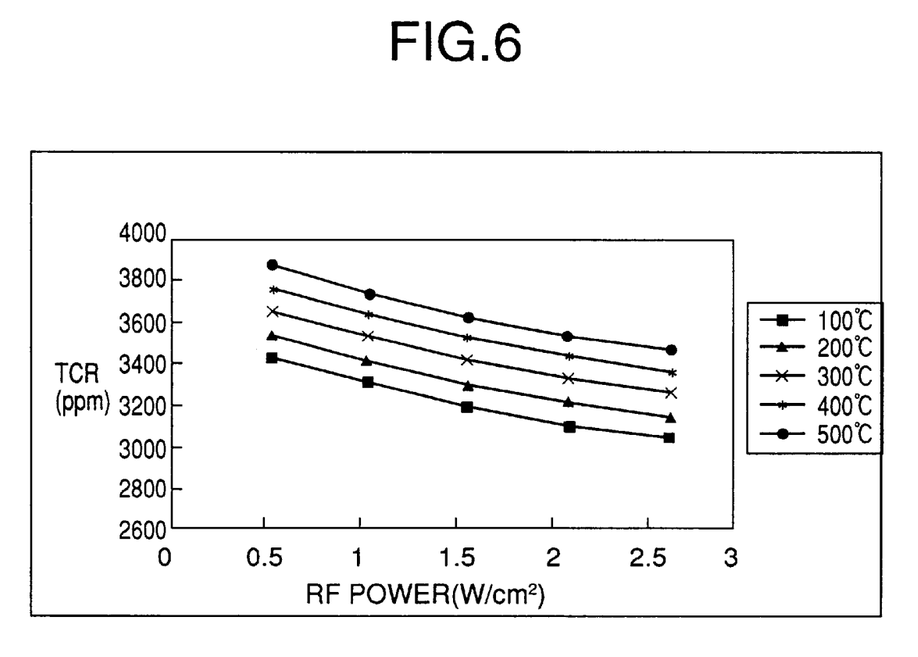
FIG. 6 is a chart for explaining a relationship between radio-frequency (RF) power and temperature coefficient of resistance (TCR) for the thin-film platinum temperature-sensitive resistor.

FIG. 5 shows a relationship between radio-frequency (RF) power and maximum crystal grain size for the thin-film platinum temperature-sensitive resistor 10. Further, FIG. 6 shows a relationship between radio-frequency (RF) power and temperature coefficient of resistance (TCR) for the thin-film platinum temperature-sensitive resistor 10. The charts of FIG. 5 and FIG. 6 are obtained from results of experiment.

Each of measurement points in the chart of FIG. 5 is given by the maximum crystal grain size of the platinum layers 6 when the RF power in the sputtering process is set at one of 0.54, 1.09, 1.64, 2.19 and 2.74 W/cm$^2$ and a temperature of the silicon substrate 1 held in the sputtering process is set at one of 100, 200, 300, 400 and 500° C. As in the chart of FIG. 5, the maximum crystal grain size of the platinum layers 6 is a function of the RF power and the temperature of the silicon substrate 1 in the sputtering process.

Specifically, when the temperature of the silicon substrate 1 is set at 500° C. or 400° C., the RF power which is set in a range of 0.54 W/cm$^2$ to 2.74 W/cm$^2$ can yield a maximum crystal grain size above 800 Å. When the temperature of the silicon substrate 1 is set at 300° C., the RF power which is set in a range of 0.54 W/cm$^2$ to 2.5 W/cm$^2$ can yield a maximum crystal grain size above 800 Å. When the temperature of the silicon substrate 1 is set at 200° C., the RF power which is set in a range of 0.54 W/cm$^2$ to 2.2 W/cm$^2$ can yield a maximum crystal grain size above 800 Å. When the temperature of the silicon substrate 1 is set at 100° C., the RF power which is set in a range of 0.54 W/cm$^2$ to 1.6 W/cm$^2$ can yield a maximum crystal grain size above 800 Å. Therefore, if the sputtering is performed under such conditions when producing the platinum layer 4 (or the platinum layers 6), the thin-film platinum temperature-sensitive resistor 10 can provide a TCR above 3200 ppm (or above the reference TCR level).

According to the method of producing the thin-film platinum temperature-sensitive resistor 10 for the thin-film microstructure sensor of the present invention, the platinum layers 6 (or the platinum layer 4) are produced by performing the sputtering process under the above-mentioned conditions, that is: the RF power is suitably set in a range of 0.54 W/cm$^2$ to 2.74 W/cm$^2$ and the temperature of the silicon substrate 1 is suitably set in a range of 100° C. to 500° C. in such a manner that the maximum crystal grain size of the platinum layers 6 is above 800 Å (or above the reference grain size) as shown in the chart of FIG. 5.

Further, each of measurement points in the chart of FIG. 6 is given by the TCR of the thin-film platinum temperature-sensitive resistor 10 when the RF power in the sputtering process is set at one of 0.54, 1.09, 1.64, 2.19 and 2.74 W/cm$^2$ and a temperature of the silicon substrate 1 held in the sputtering process is set at one of 100, 200, 300, 400 and 500° C. As in the chart of FIG. 6, the TCR of the thin-film platinum temperature-sensitive resistor 10 is a function of the RF power and the temperature of the silicon substrate 1 used in the sputtering process.

Specifically, when the temperature of the silicon substrate 1 is set in a range of 300° C. to 500° C., the RF power which is set in the range of 0.54 W/cm$^2$ to 2.74 W/cm$^2$ can yield a TCR above 3200 ppm. When the temperature of the silicon substrate 1 is set at 200° C., the RF power which is set in the range of 0.54 W/cm$^2$ to 2.4 W/cm$^2$ can yield a TCR above 3200 ppm. When the temperature of the silicon substrate 1 is set at 100° C., the RF power which is set in the range of 0.54 W/cm$^2$ to 1.6 W/cm$^2$ can yield a TCR above 3200 ppm.

According to the method of producing the thin-film platinum temperature-sensitive resistor 10 for the thin-film microstructure sensor of the present invention, the platinum layers 6 (or the platinum layer 4) are produced by performing the sputtering under the above-mentioned conditions, that is: the RF power is suitably set in a range of 0.54 W/cm$^2$ to 2.74 W/cm$^2$ and the temperature of the silicon substrate 1 is suitably set in a range of 100° C. to 500° C. in such a manner that the thin-film platinum temperature-sensitive resistor 10 provides a TCR above 3200 ppm (or above the reference TCR level) as shown in the chart of FIG. 6. Therefore, according to the present invention, it is possible that the thin-film platinum temperature-sensitive resistor 10 can provide a large TCR with little variation for measurement of a fluid flow rate or the like.

Figure 7:
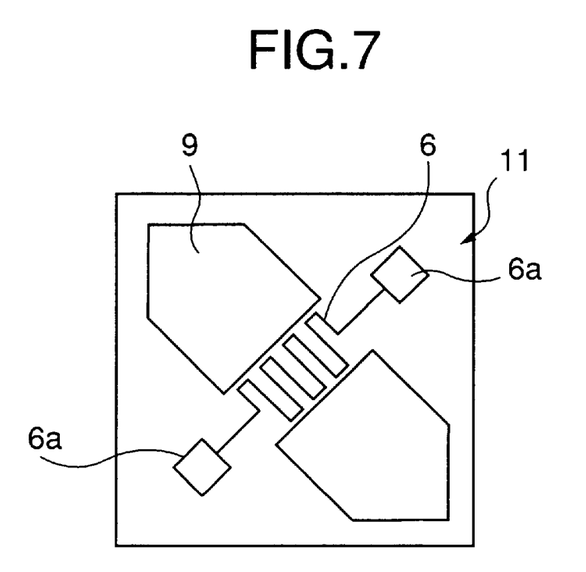
FIG. 7 is a top view of a thin-film platinum temperature-sensitive resistor for a second embodiment of the thin-film microstructure sensor of the present invention.
Figure 8:
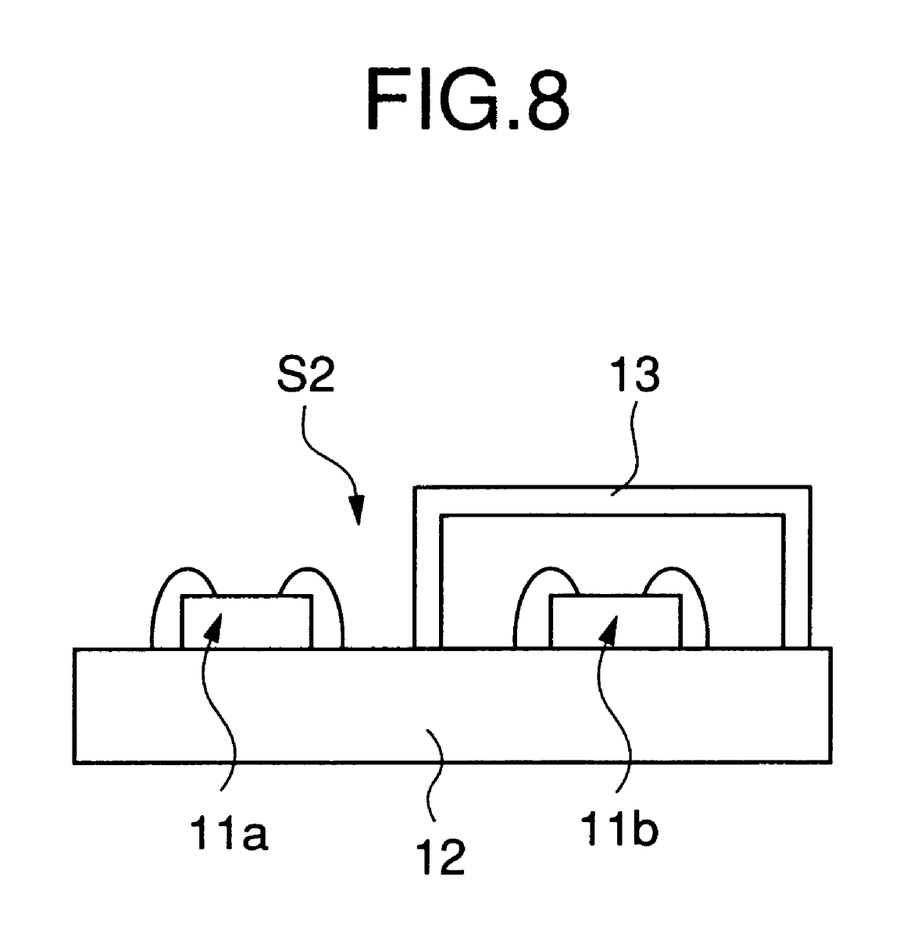
FIG. 8 is a diagram for explaining a construction of the second embodiment of the thin-film microstructure sensor.

Next, FIG. 7 shows a thin-film platinum temperature-sensitive resistor for a second embodiment of the thin-film microstructure sensor of the present invention. FIG. 8 shows a construction of the second embodiment of the thin-film microstructure sensor.

In FIG. 7 and FIG. 8, the elements which are the same as corresponding elements in FIG. 1A through FIG. 2 are designated by the same reference numerals, and a duplicate description will be omitted.

As shown in FIG. 7, a humidity sensor S2, which is the second embodiment of the thin-film micro-structure sensor, comprises a thin-film platinum temperature-sensitive resistor 11 provided on the insulation layer of the silicon substrate 1. The thin-film platinum temperature-sensitive resistor 11 (which will be called a resistor chip) of the present embodiment is produced by performing the same production process as the thin-film platinum temperature-sensitive resistor 10 of FIG. 2. The platinum layer 6 and the recessed portion 9 in the present embodiment are formed by performing the same production process as the platinum layers 6 and the recessed portion 9 in the first embodiment of FIG. 2.

As shown in FIG. 8, the humidity sensor S2 of the present embodiment comprises two resistor chips 11a and 11b provided on an implementation board 12. Each of the resistor chips 11a and 11b corresponds to the thin-film platinum temperature-sensitive resistor 11 of FIG. 7.

The elements of the thin-film platinum temperature-sensitive resistor 11 of FIG. 7 are essentially the same as corresponding elements of the thin-film platinum temperature-sensitive resistor 10 of FIG. 2 except that in the present embodiment a single platinum layer 6 is provided on the substrate 1 in place of the two platinum layers 6 in the embodiment of FIG. 2.

In the humidity sensor S2 of FIG. 8, a humidity is measured based on a change in an ambient temperature around the humidity sensor S2. In order to avoid variation of a measured humidity due to a change in an ambient temperature around the humidity sensor S2, the humidity sensor S2 of FIG. 8 comprises the resistor chip 11a and the resistor chip 11b on the implementation board 12. The resistor chip 11a is exposed on an external surface of the implementation board 12, and the resistor chip 11b is enclosed in an enclosure case 13 on the implementation board 12. An internal space of the enclosure case 13 is filled with inert gas. The resistor chip 11b is hermetically sealed by the enclosure case 13 and placed in the inert gas. Thus, a change in humidity of an ambient atmosphere affects only the resistor chip 11a, but the resistor chip 11b is not affected by the humidity change.

The humidity sensor S2 includes a control circuit (not shown) connected to both the pads 6a of the resistor chip 11a and the pads 6a of the resistor chip 11b, and this control circuit is similar to the control circuit of the flow sensor S1. The control circuit supplies voltage to the platinum layers 6 of the resistor chips 11a and 11b via the pads 6a so as to increase the temperature of the platinum layers 6 to about 400° C. When a humidity of the ambient atmosphere is equal to zero, the voltages supplied to the platinum layers 6 of the resistor chips 11a and 11b are controlled by the control circuit such that the supplied voltages are equal to each other. When the humidity sensor S2 is subjected to a change in the humidity of the ambient atmosphere, the resistor chip 11b (which is placed in the inert gas atmosphere of the enclosure case 13) is not affected by the change in the humidity, only the resistor chip 11a is affected. The voltage supplied to the platinum layer 6 of the resistor chip 11b remains unchanged, but the voltage supplied to the platinum chip 6 of the resistor chip 11a changes due to a change of heat dissipation caused by the change in the humidity. In the humidity sensor S2 under this condition, a humidity of the ambient atmosphere is measured based on a difference between the voltage supplied to the platinum layer 6 of the resistor chip 11a and the voltage supplied to the platinum layer 6 of the resistor chip 11b. The humidity sensor S1 outputs a signal indicating the measured humidity.

FIG. 9A through FIG. 9E show a method of producing a thin-film platinum temperature-sensitive resistor for a third embodiment of the thin-film microstructure sensor of the present invention. FIG. 10 shows the third embodiment of the thin-film microstructure sensor. The thin-film microstructure sensor of the present embodiment is a gas sensor S3 which outputs a signal indicating whether a gas in an ambient atmosphere is detected.

Figure 9A:
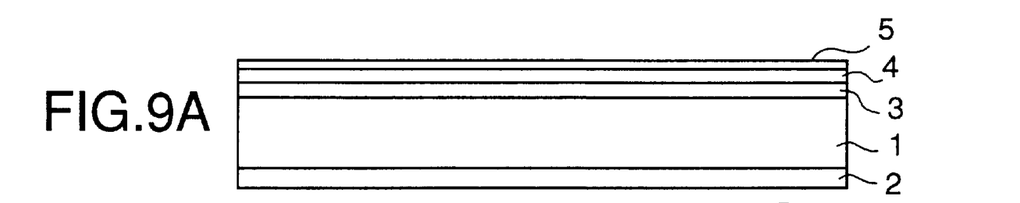
FIG. 9A through FIG. 9E are diagrams for explaining a method of producing a thin-film platinum temperature-sensitive resistor for a third embodiment of the thin-film microstructure sensor of the present invention.
Figure 10:
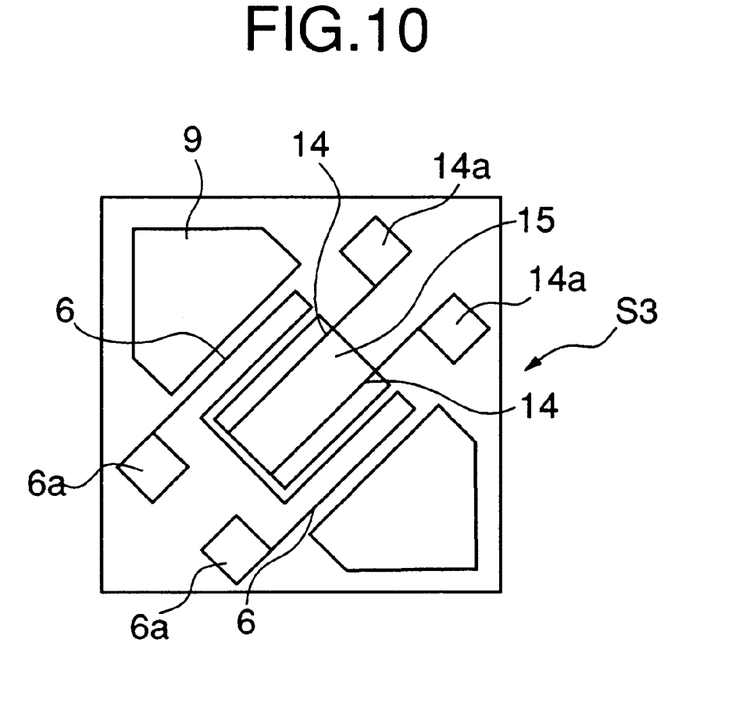
FIG. 10 is a top view of the third embodiment of the thin-film microstructure sensor.

As shown in FIG. 9A, the silicon substrate 1 is a substrate in the present embodiment. First, the silicon dioxide layer 2 is formed on the bottom surface of the silicon substrate 1 in order to avoid etching of the bottom surface of the silicon substrate 1 during an anisotropic etching step which is subsequently performed. On the top surface of the silicon substrate 1, the insulation layer 3, the platinum layer 4 and the insulation layer 5 are formed in this order. The insulation layer 5 is used as the mask in the patterning of the platinum layer 4. These layers 2–5 are provided on the silicon substrate 1 as shown in FIG. 9A.

Figure 9B:
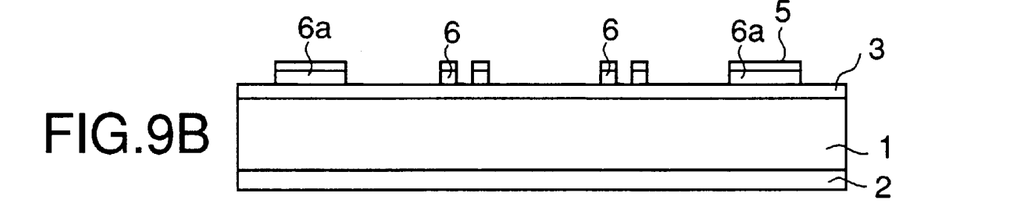

Next, as shown in FIG. 9B, the patterning of the platinum layer 4 with the insulation layer 5 is performed in order to create a pattern of a thin-film platinum temperature-sensitive resistor 16 from the platinum layer 4. Specifically, photo-lithography and etching steps for the insulation layer 5 are performed, and by using the resulting insulation layer 5 an etching step for the platinum layer 4 is performed. In the present embodiment, the resulting pattern of the thin-film platinum temperature-sensitive resistor 16 includes, as shown in FIG. 10, the two platinum layers 6, and the pads 6a provided at ends of each of the platinum layers 6.

Figure 9C:
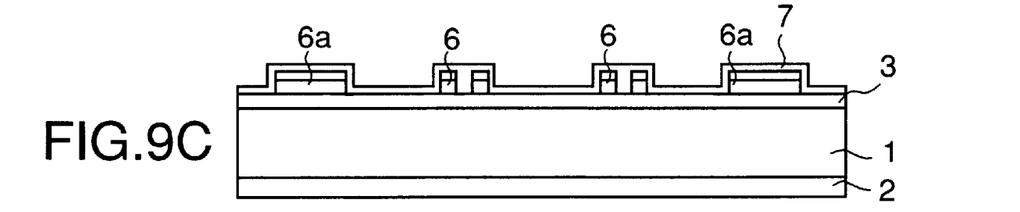

Next, as shown in FIG. 9C, the passivation layer 7 is formed on the external surface of the silicon substrate 1 so as to cover the platinum layers 6 and the pads 6a.

Figure 9D:
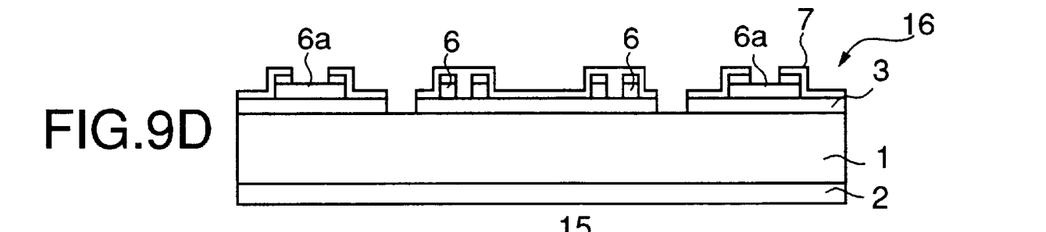

Next, as shown in FIG. 9D, the patterning of the passivation layer 7 is performed. Specifically, the photomask (not shown) is placed on the external surface of the silicon substrate 1, and an etching step for predetermined portions of the passivation layer 7 and the insulation layer 3 is performed, so that the middle portion of each of the pads 6a and the portion of the top surface of the silicon substrate 1 are exposed by removing the passivation layer 7 and the insulation layer 3.

The production steps of the present embodiment shown in FIG. 9A through FIG. 9D are essentially the same as the previously-described production steps of the first embodiment shown in FIG. 1A through FIG. 1D.

Figure 9E:
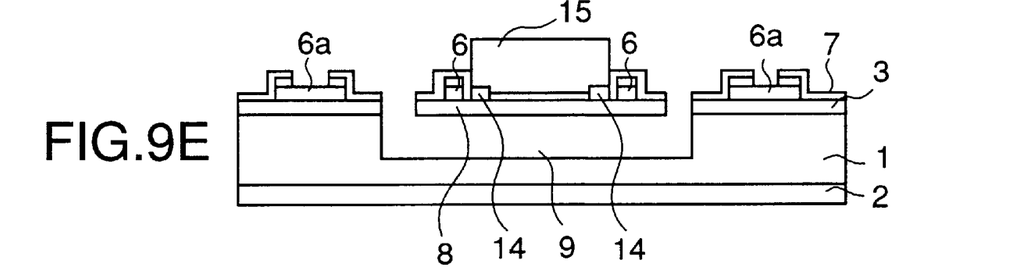

Further, as shown in FIG. 9E, two gas-sensitive semiconductor electrodes 14, and pads 14a at ends of each of the electrodes 14 are formed on the insulation layer 3 of the bridge portion 8 in the middle of the silicon substrate 1. Further, a gas-sensitive semiconductor 15 is formed on the gas-sensitive semiconductor electrodes 14. The gas-sensitive semiconductor 15 in this embodiment is produced through a chemical vapor deposition (CVD) of $SnO_2$, and a thickness of the gas-sensitive semiconductor 15 is about 1 $\mu$m.

Finally, as shown in FIG. 9E, the bridge portion 8 and the recessed portion 9 are formed in the middle of the silicon substrate 1. Specifically, the anisotropic etching step for the above-mentioned portion of the top surface of the silicon substrate 1, from which the insulation layer 3 has been removed, is performed to form the recessed portion 9 in the silicon substrate 1. The resulting pattern of the recessed portion 9 is as shown in FIG. 10. The remaining portion of the insulation layer 3 after the recessed portion 9 is formed becomes the bridge portion 8. Thus, the bridge portion 8 is provided over the recessed portion 9, and the bridge portion 8 includes the platinum layers 6, the electrodes 14, the gas-sensitive semiconductor 15 and the insulation layer 3. The anisotropic etching in the present embodiment is the same as the anisotropic etching as shown in FIG. 1E.

By performing the above-described steps of the production method, the thin-film platinum temperature-sensitive resistor 16 shown in FIG. 9D is produced. The thin-film platinum temperature-sensitive resistor 16 in the present embodiment comprises the platinum layers 6, the pads 6a, the gas-sensitive semiconductor electrodes 14, the pads 14a and the gas-sensitive semiconductor 15.

Further, a wire bonding step for the thin-film platinum temperature-sensitive resistor 16 is performed to electrically connect the pads 6a and the pads 14a with a control circuit (not shown) by wires, so that the gas sensor S3, including the thin-film platinum temperature-sensitive resistor 16 and the control circuit, is produced.

As shown in FIG. 10, the gas sensor S3 is placed in an ambient atmosphere in order to detect whether a gas is included in the ambient atmosphere. The control circuit (not shown) of the gas sensor S3 supplies voltage to the platinum layers 6 via the pads 6a and supplies voltage to the electrodes 14 via the pads 14a so as to increase both the temperatures of the platinum layers 6 and the electrodes 14 to about 400° C.

When no specific gas is included in the ambient atmosphere, the voltage supplied to the platinum layers 6 and the voltage supplied to the electrodes 14 are controlled by the control circuit such that the supplied voltages are equal to each other. When a reducing gas is included in the ambient atmosphere, a value of resistance of the gas-sensitive semiconductor 15 is decreased due to the reducing gas. When an oxidizing gas is included in the ambient atmosphere, a value of resistance of the gas-sensitive semiconductor 15 is increased due to the oxidizing gas. The voltage supplied to the platinum layers 6 remains unchanged, but the voltage supplied to the electrodes 14 changes due to a change in the resistance of the gas-sensitive semiconductor 15. In the gas sensor S3, the presence of a gas in the ambient atmosphere is detected based on a difference between the voltage supplied to the platinum layers 6 and the voltage supplied to the electrodes 14. The gas sensor S3 outputs a signal indicating whether a gas in the ambient atmosphere is detected.

Figure 11:
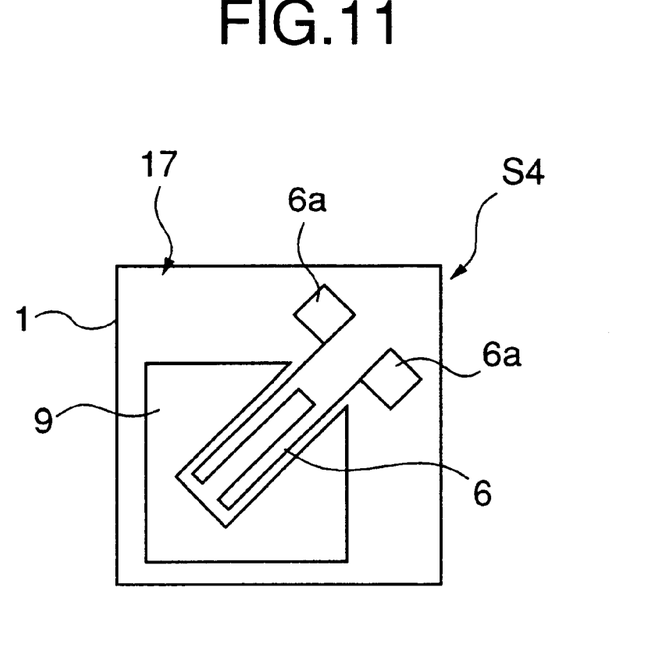
FIG. 11 is a top view of a fourth embodiment of the thin-film microstructure sensor of the present invention.

FIG. 11 shows a fourth embodiment of the thin-film microstructure sensor of the present invention. A temperature sensor S4 as the thin-film microstructure sensor in the present embodiment is shown in FIG. 11.

The elements of a thin-film platinum temperature-sensitive resistor 17 of FIG. 11 are essentially the same as corresponding elements of the thin-film platinum temperature-sensitive resistor 10 of FIG. 2 except that in the present embodiment a single platinum layer 6 is provided on the silicon substrate 1 in place of the two platinum layers 6 in the embodiment of FIG. 2, and that in the present embodiment a cantilever portion in the middle of the silicon substrate 1 is provided, the cantilever portion extending diagonally over the recessed portion 9, in place of the bridge portion 8 provided over the recessed portion 9 in the embodiment of FIG. 2.

As shown in FIG. 11, the platinum layer 6 and the recessed portion 9 in the present embodiment are formed by performing the same production process as the platinum layers 6 and the recessed portion 9 of the first embodiment of FIG. 2. Further, a wire bonding step for the thin-film platinum temperature-sensitive resistor 17 is performed to electrically connect the pads 6a with a control circuit (not shown) by wires, so that the temperature sensor S4, including the thin-film platinum temperature-sensitive resistor 17 and the control circuit, is produced.

In the temperature sensor S4 of FIG. 11, resistance-temperature characteristics of the thin-film platinum temperature-sensitive resistor 17 are utilized for measuring a temperature of an ambient atmosphere. Since a value of the resistance of the platinum layer 6 changes in response to a change in the temperature of the ambient atmosphere in which the temperature sensor S4 is placed, a temperature of the ambient atmosphere is measured by the temperature sensor S4 based on a change in the resistance of the platinum layer 6. The temperature sensor S4 outputs a signal indicating the measured temperature.

Further, the present invention is not limited to the above-described embodiments, and variations and modifications may be made without departing from the scope of the present invention.

What is claimed is:

1. A thin-film microstructure sensor comprising:

a substrate having an insulation layer;

a thin-film platinum temperature-sensitive resistor provided on the insulation layer of the substrate, said thin-film platinum temperature-sensitive resistor comprising at least one platinum layer, said at least one platinum layer having a maximum crystal grain size above a reference grain size; and an implementation board, two resistor chips provided on the implementation board and an enclosure case provided on the implementation board to hermetically seal one of the resistor chips, each of said resistor chips including the thin-film platinum temperature-sensitive resistor having a single platinum layer, the platinum layers of the resistor chips being provided to measure a humidity of an ambient atmosphere.

2. The thin-film microstructure sensor according to claim 1 wherein said reference grain size is 800 Å.

3. The thin-film microstructure sensor according to claim 1, wherein said thin-film platinum temperature-sensitive resistor includes two platinum layers extending in parallel with each other, said two platinum layers being provided on the insulation layer of the substrate to measure a flow rate of a fluid.

4. The thin-film microstructure sensor according to claim 1, wherein said thin-film platinum temperature-sensitive resistor further comprises:

two electrodes provided on the insulation layer of the substrate;

pads provided at ends of each of the electrodes, the pads electrically connected to the electrodes; and a gas-sensitive semiconductor provided on the electrodes, wherein said thin-film platinum temperature-sensitive resistor includes two platinum layers extending in parallel with each other, and said platinum layers, said electrodes and said gas-sensitive semiconductor are provided to detect a gas in an ambient atmosphere.

5. The thin-film microstructure sensor according to claim 1, wherein said thin-film platinum temperature-sensitive resistor includes a single platinum layer, said platinum layer being provided on the insulation layer to measure a temperature of an ambient atmosphere.

6. The thin-film microstructure sensor according to claim 1, wherein the at least one platinum layer has a thickness of approximately 1200 Å.

* * * * *